United States Patent
Kang

(10) Patent No.: US 8,836,118 B2
(45) Date of Patent: Sep. 16, 2014

(54) ELECTRONIC DEVICE PACKAGES INCLUDING BUMP BUFFER SPRING PADS AND METHODS OF MANUFACTURING THE SAME

(71) Applicant: SK hynix Inc., Icheon-si (KR)

(72) Inventor: Tae Min Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,311

(22) Filed: Dec. 18, 2012

(65) Prior Publication Data

US 2013/0292820 A1 Nov. 7, 2013

(30) Foreign Application Priority Data

May 3, 2012 (KR) ........................ 10-2012-0047107

(51) Int. Cl.
| H01L 23/48 | (2006.01) |
|---|---|
| H01L 21/768 | (2006.01) |
| H01L 23/00 | (2006.01) |
| H01L 23/31 | (2006.01) |

(52) U.S. Cl.
CPC ......... *H01L 23/48* (2013.01); *H01L 2224/1146* (2013.01); *H01L 2224/05026* (2013.01); *H01L 2224/0401* (2013.01); *H01L 2224/05573* (2013.01); *H01L 24/11* (2013.01); *H01L 2224/05005* (2013.01); *H01L 2224/05666* (2013.01); *H01L 2224/05655* (2013.01); *H01L 2224/05672* (2013.01); *H01L 2224/16237* (2013.01); *H01L 24/05* (2013.01); *H01L 2224/05147* (2013.01); *H01L 24/03* (2013.01); *H01L 2224/05084* (2013.01); *H01L 2224/05571* (2013.01); *H01L 2224/05572* (2013.01); *H01L 24/13* (2013.01); *H01L 2224/73204* (2013.01); *H01L 2224/13147* (2013.01); *H01L 2224/05124* (2013.01); *H01L 2224/05172* (2013.01); *H01L 2224/05144* (2013.01); *H01L 2224/05155* (2013.01); *H01L 2224/32225* (2013.01); *H01L 2224/13082* (2013.01); *H01L 2224/13022* (2013.01); *H01L 23/3192* (2013.01); *H01L 2224/1174* (2013.01); *H01L 21/768* (2013.01); *H01L 2224/05644* (2013.01); *H01L 2224/05166* (2013.01); *H01L 2924/15311* (2013.01); *H01L 2224/05657* (2013.01)
USPC ........... 257/737; 257/738; 257/773; 257/776; 257/780; 257/784; 438/612; 438/613; 438/614; 438/615

(58) Field of Classification Search
USPC ................ 257/737, 738, 773, 776, 780, 784; 438/612–615
See application file for complete search history.

(56) References Cited

U.S. PATENT DOCUMENTS

| 6,462,426 B1 * | 10/2002 | Kelkar et al. ................. 257/781 |
|---|---|---|
| 7,025,600 B2 * | 4/2006 | Higashi .......................... 439/66 |
| 7,550,855 B2 * | 6/2009 | Hantschel et al. ............ 257/776 |
| 7,628,616 B2 * | 12/2009 | Yoshida et al. ................ 439/66 |

(Continued)

FOREIGN PATENT DOCUMENTS

KR 10-1009192 B1 1/2011

*Primary Examiner* — Lex Malsawma
*Assistant Examiner* — Sheng Zhu
(74) *Attorney, Agent, or Firm* — William Park & Associates Patent Ltd.

(57) ABSTRACT

Electronic device packages and related methods are provided. The electronic device package includes a first substrate having a first contact portion disposed thereon, a bump having a first contact surface connected to the first contact portion and a second contact surface disposed opposite to the first contact surface, and a buffer spring pad portion between the first contact portion of the first substrate and the first contact surface of the bump. The buffer spring pad portion includes at least two different conductive material layers which are stacked.

23 Claims, 5 Drawing Sheets

(56) References Cited

U.S. PATENT DOCUMENTS

| | | | |
|---|---|---|---|
| 7,750,487 B2 * | 7/2010 | Muthukumar et al. | 257/785 |
| 2006/0261491 A1 * | 11/2006 | Soeta et al. | 257/777 |
| 2008/0251914 A1 * | 10/2008 | Fujiwara | 257/737 |
| 2010/0187688 A1 * | 7/2010 | Hochstenbach | 257/738 |

* cited by examiner

ELECTRONIC DEVICE PACKAGES INCLUDING BUMP BUFFER SPRING PADS AND METHODS OF MANUFACTURING THE SAME

CROSS-REFERENCE TO RELATED APPLICATION

The present application claims priority under 35 U.S.C 119(a) to Korean Application No. 10-2012-0047107, filed on May 3, 2012, in the Korean intellectual property Office, which is incorporated herein by reference in its entirety as set forth in full.

BACKGROUND

1. Technical Field

Embodiments of the present disclosure generally relate to electronic device packages and, more particularly, to electronic device packages including bump buffer spring pads and methods of manufacturing the same.

2. Related Art

Electronic devices employed in electronic systems may include various circuit elements such as active elements and/or passive elements. The circuit elements may be integrated in and/or on a semiconductor substrate, thereby constituting the electronic device (also, referred to as a semiconductor chip or a semiconductor die). The electronic device may be mounted on a printed circuit board (PCB) or a package substrate to produce an electronic device package. The package substrate may include circuit interconnections such as silicon interposers. The electronic device package may be mounted on a main board to constitute the electronic systems, for example, computers, mobile systems or data storage media.

Bumps are widely used in fabrication of the electronic device packages. The bumps may electrically connect the semiconductor chips to the package substrates or may electrically connect the semiconductor chips to each other. For example, the bumps may be employed in flip chip packages to realize diverse stack structures of the semiconductor chips and/or to increase the number of input/output terminals. In the fabrication of the flip chip packages, the bumps may be surrounded by an under fill material to electrically insulate the bumps after the semiconductor chips are electrically connected to the package substrates through the bumps.

As the mobile systems become more widely used and the semiconductor chips become more highly integrated, the electronic device packages such as the flip chip packages have been continuously scaled down. This may lead to reduction of the height or the size of the bumps used in the electronic device packages. As the size of the bumps is reduced, high reliability of the bumps may be more required. That is, if the size of the bumps is reduced, a physical stress and/or an impact may be more readily generated when the bumps are combined with landing pads of the package substrates or the semiconductor chips using an adhesion layer. The physical stress and/or the impact may remain in the package substrates or the semiconductor chips and may cause process failures such as cracks or delamination of metal pads (or metal interconnection lines). In addition, the physical stress and/or the impact may cause crystalline defects such as dislocations in active regions of semiconductor substrates acting as base material layers of the semiconductor chips. Accordingly, theses process failures may degrade the reliability of the electronic device packages.

SUMMARY

Various embodiments are directed to electronic device packages including bump buffer spring pads and methods of manufacturing the same.

According to various embodiments, an electronic device package includes a first substrate having a first contact portion disposed thereon, a bump having a first contact surface connected to the first contact portion and a second contact surface disposed opposite to the first contact surface, and a buffer spring pad portion between the first contact portion of the first substrate and the first contact surface of the bump. The buffer spring pad portion includes at least two different conductive material layers which are stacked.

According to various embodiments, an electronic device package includes a first substrate having a first contact portion disposed thereon, a first dielectric layer disposed on the first substrate to have a first window exposing the first contact portion, a bump having a first contact surface connected to the first contact portion and a second contact surface disposed opposite to the first contact surface, and a buffer spring pad portion between the first contact portion of the first substrate and the first contact surface of the bump. The buffer spring pad portion includes at least two different conductive material layers which are stacked.

According to various embodiments, an electronic device package includes a first substrate having a first contact portion disposed thereon, a first dielectric layer disposed on the first substrate to have a first window exposing the first contact portion, a bump having a first contact surface connected to the first contact portion and a second contact surface disposed opposite to the first contact surface, and a buffer spring pad portion between the first contact portion of the first substrate and the first contact surface of the bump. The buffer spring pad portion includes a plurality of conductive material layers which are stacked in the first window.

According to various embodiments, a method of manufacturing an electronic device package includes providing a first substrate having a first contact portion, stacking at least two different conductive material layers on the first contact portion to form a buffer spring pad portion, and forming a bump that has a first contact surface connected to the buffer spring pad portion and a second contact surface located opposite to the first contact surface. The buffer spring pad portion is disposed between the bump and the first contact portion to suppress or prevent a stress applied to or generated in the bump from being conducted to the first contact portion and an active region of the first substrate.

In various embodiments, the at least two different conductive material layers may have different thickness from each other.

In various embodiments, the buffer spring pad portion may include a first conductive layer and a second conductive layer which is thicker than the first conductive layer.

In various embodiments, the buffer spring pad portion may further include at least one additional first conductive layer and at least one additional second conductive layer which are alternatively stacked on a surface of the second conductive layer opposite to the first conductive layer.

In various embodiments, the buffer spring pad portion may further include a third conductive layer which is stacked on a surface of the second conductive layer opposite to the first conductive layer. The third conductive layer may be thinner than the second conductive layer.

In various embodiments, the first conductive layer may be in contact with the first contact portion.

In various embodiments, the first conductive layer and the at least one additional first conductive layer may be the same material layer or different material layers, and the second conductive layer and the at least one additional second conductive layer may be the same material layer or different material layers.

In various embodiments, the third conductive layer may extend to substantially cover a corner region of the first dielectric layer outside the first window, and a surface of the second conductive layer opposite to the first conductive layer may be substantially coplanar with a surface of the first dielectric layer opposite to the first substrate.

In various embodiments, the third conductive layer may include the same material layer as the first conductive layer.

In various embodiments, the first, second or third conductive layer may include at least one of an aluminum (Al) layer, a copper (Cu) layer, a cobalt (Co) layer, a titanium (Ti) layer, a nickel (Ni) layer, a gold (Au) layer and a vanadium (V) layer.

In various embodiments, each of the first and third conductive layers may include an under bump metal (UBM) layer, and the second conductive layer includes an aluminum (Al) layer or a copper (Cu) layer.

In various embodiments, the second conductive layer may include the same material as the bump.

In various embodiments, the electronic device package may further include a second dielectric layer on a surface of the first dielectric layer opposite to the first substrate. The buffer spring pad portion may be disposed in the first window and may be exposed by a second window penetrating the second dielectric layer.

In various embodiments, the bump may include a protrusion filling the second window and a bump body extending from the protrusion onto a surface of the second dielectric layer outside the second window. The bump body may have a diameter or a width which is greater than that of the protrusion.

In various embodiments, a portion of the buffer spring pad portion may extend onto a surface of the second dielectric layer opposite to the first dielectric layer.

In various embodiments, the buffer spring pad portion may extend to fill the second window. The buffer spring pad portion may include at least one first conductive layer and at least one second conductive layer which are alternately stacked in the first window, a third conductive layer and a fourth conductive layer stacked in the second window, and a fifth conductive layer disposed on the fourth conductive layer and the second dielectric layer. The fifth conductive layer may be thinner than the fourth conductive layer.

In various embodiments, a surface of the fourth conductive layer opposite to the third conductive layer may be substantially coplanar with a surface of the second dielectric layer opposite to the first dielectric layer. The fifth conductive layer may extend to substantially cover the surface of the second dielectric layer. The bump may be in contact with a surface of the fifth conductive layer opposite to the fourth conductive layer.

In various embodiments, the fourth conductive layer may include the same conductive material as the bump, and the fifth conductive layer may include an under bump metal (UBM) layer.

In various embodiments, at least one of the first substrate and the second substrate may include a semiconductor substrate having an integrated circuit or a package substrate on which the semiconductor substrate is mounted.

In various embodiments, the buffer spring pad portion may include a first under bump metal (UBM) layer, a aluminum (Al) layer, a second under bump metal (UBM) layer, a copper (Cu) layer and a third under bump metal (UBM) layer which are sequentially stacked in the first window.

In various embodiments, the electronic device package may further include a second dielectric layer stacked on a surface of the first dielectric layer opposite to the first substrate. In such a case, the buffer spring pad portion may be exposed by a second window penetrating the second dielectric layer, the bump may include a protrusion disposed in the second window to contact the buffer spring pad portion and a bump body extending from the protrusion onto a surface of the second dielectric layer outside the second window, and the bump body may have a diameter or a width which is greater than that of the protrusion.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
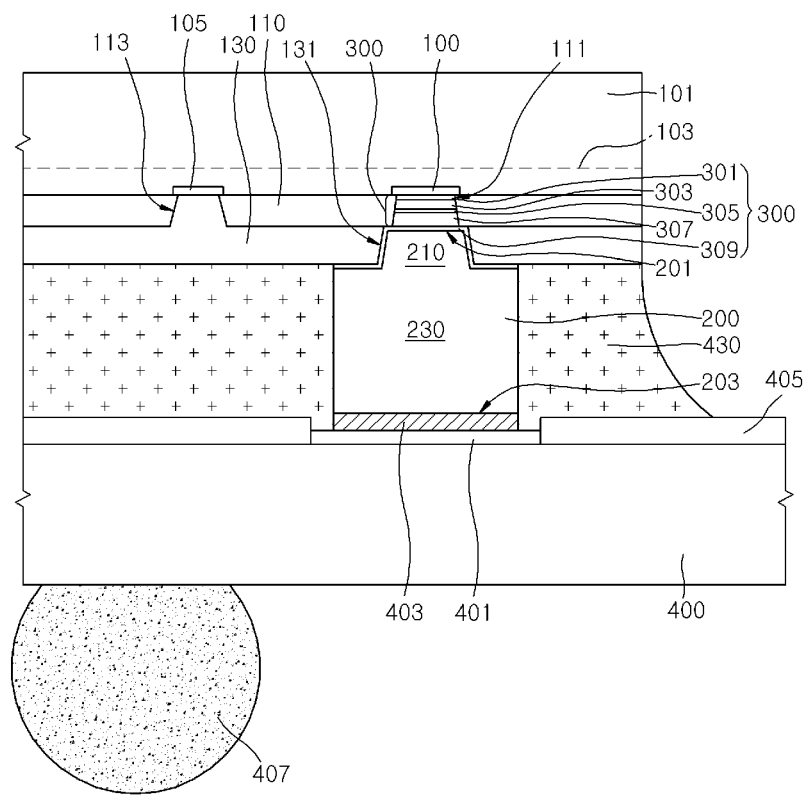
FIG. 1 is a cross sectional view illustrating an electronic device package according to an embodiment.

Various embodiments may employ bump buffer spring pad portions (also, referred to as buffer spring pad portions) that are disposed at interfaces between pads of a semiconductor substrate and bumps to alleviate a physical stress. The bump buffer spring pad portions may act as stress relief structures that suppress or prevent the physical stresses generated when the bumps are formed or generated due to thermal deformation of electronic device packages from being directly conducted to pads under the bumps or active regions of the semiconductor substrate including the pads. Accordingly, the bump buffer spring pad portions may suppress formation of cracks in metal lines disposed on the semiconductor substrate and/or lamination of the metal lines.

Each of the bump buffer spring pad portions may exhibit a plate-shaped spring structure that includes a plurality of thin conductive layers which are stacked. At least two different conductive material layers, for example, a first conductive layer and a second conductive layer may be alternately stacked to constitute each of the bump buffer spring pad portions. In such a case, the first conductive layer may have a different stiffness from the second conductive layer. A general copper pillar bump may be composed of a single material, namely a single layer of copper material. Thus, the general copper pillar bump may have a sole stiffness. Additionally, each of the bump buffer spring pad portions may have a spring-shaped structure including a plurality of thin conductive layers which are alternately stacked, and the plurality of thin conductive layers in each of the bump buffer spring pad portions may have different stiffness from each other to produce elasticity. Accordingly, the bump buffer spring pad portions may relieve stresses applied to the bumps adjacent to the bump buffer spring pad portions.

The stress generated due to formation of the bumps or due to thermal deformation of the electronic device packages may be concentrated at the interfaces between the bumps and the pads. This may cause cracks in metal lines adjacent to the pads or delamination of the metal lines. Thus, if the bump buffer spring pad portions are disposed between the bumps and the pads, the bump buffer spring pad portions may suppress or prevent the physical stresses from being directly conducted to pads under the bumps or active regions of the semiconductor substrate including the pads.

It will be understood that although the terms first, second, third etc. may be used herein to describe various elements, these elements should not be limited by these terms. These terms are only used to distinguish one element from another element. Thus, a first element in various embodiments could be termed a second element in other embodiments without departing from the teachings of the present invention. As used herein, the term "and/or" includes any and all combinations of one or more of the associated listed items.

It will be also understood that when an element is referred to as being located "under", "beneath", "below", "lower", "on", "over", "above", "upper", "side" or "aside" another element, it can be directly contact the other element, or at least one intervening element may also be present therebetween. Accordingly, the terms such as "under", "beneath", "below", "lower", "on", "over", "above", "upper", "side", "aside" and the like which are used herein are for the purpose of describing particular embodiments only and are not intended to limit the inventive concept.

It will be further understood that the term "substrate" used herein may correspond to a semiconductor substrate having a semiconductor chip in which an integrated circuit such as a DRAM circuit or a flash memory circuit is realized or may correspond to a package substrate such as a printed circuit board (PCB) or an interposer. Moreover, it will be understood that the term "contact portion" used herein may correspond to a conductive member for electrical connection, for example, an interconnection pad or a landing pad. In addition, the term "bump" used herein may correspond to a copper pillar bump. However, the embodiments may be applicable to the electronic device packages including other bumps, for example, solder bumps or conductive pastes.

Figure 2:
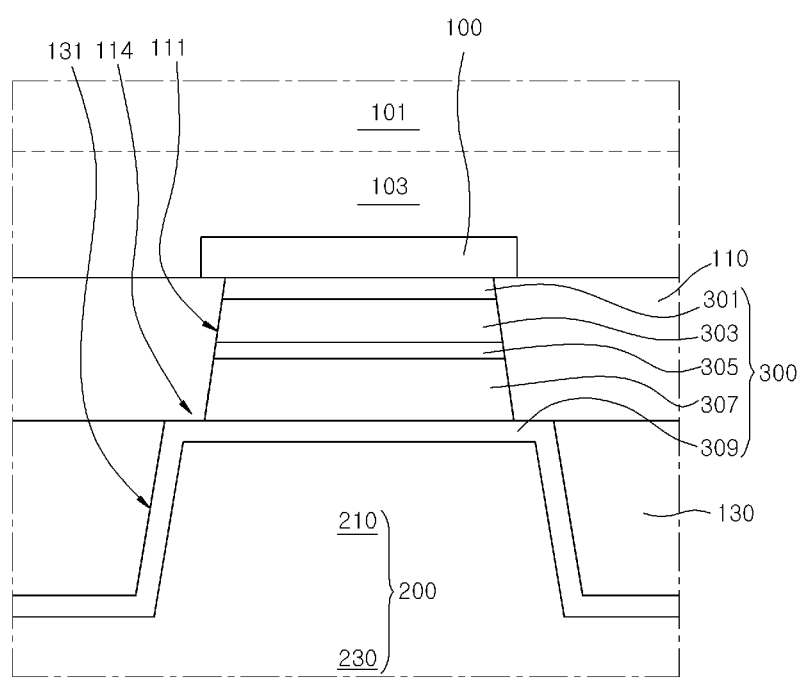
FIG. 2 is a cross sectional view illustrating a bump buffer spring pad portion employed in the electronic device package according to an embodiment.

FIG. 1 is a cross sectional view illustrating an electronic device package according to an example embodiment, and FIG. 2 is a cross sectional view illustrating a bump buffer spring pad portion employed in the electronic device package according to an embodiment.

Referring to FIGS. 1 and 2, an electronic device package according to an embodiment may include a first substrate 101 having a first contact portion 100, a bump 200 having a first contact surface 201 connected to the first contact portion 100 and a second contact surface 203 located opposite to the first contact surface 201, and a buffer spring pad portion 300 disposed between the first contact portion 100 and the first contact surface 201. The electronic device package according to an embodiment may further include a second substrate 400 having a second contact portion 401 that corresponds to the first contact portion 100 of the first substrate 101. The second contact surface 203 of the bump 200 and the second contact portion 401 of the second substrate 400 may be combined with each other by an adhesion layer 403 disposed therebetween. The adhesion layer 403 may include a solder layer.

The first substrate 101 may be a semiconductor chip or a semiconductor die in which an integrated circuit is realized. In various embodiments, the first substrate 101 may be a semiconductor wafer including a plurality of semiconductor chips or a plurality of semiconductor dice. In various embodiments, the plurality of semiconductor chips of the semiconductor wafer may be separated from each other using a die sawing technique performed in a subsequent process. The first contact portion 100 may be a connection pad for electrically connecting an integrated circuit realized in an active region 103 (see also FIGS. 3 and 4) of the first substrate 101 to an external device. The first contact portion 100 may include a metal pad such as an aluminum pad. The first contact portion 100 may be electrically connected to the integrated circuit in the first substrate 101 using a metal interconnection line. The second substrate 400 on which the first substrate 101 (e.g., a semiconductor chip) is flipped and mounted may include the second contact portion 401 acting as a landing pad connected to the bump 200. That is, the first substrate 101 may correspond to a flip chip. The second contact portion 401 may be exposed by a solder resist pattern 405, and the second substrate 400 including the solder resist pattern 405 may be a printed circuit board (PCB). The second contact portion 401 may constitute circuit patterns disposed on or in the second substrate 400. Although not shown in the drawings, the electronic device package according to an embodiment may further include a conductive via penetrating the second substrate 400 and an external terminal 407 such as a solder ball disposed on a back side surface of the second substrate 400 substantially opposite to the second contact portion 401.

When the electronic device package according to an embodiment corresponds to a flip chip package having a thickness of about 0.515 millimeters, the first substrate 101 may be a flip chip and the flip chip may be fabricated to have a thickness of about 0.25 millimeters. In such a case, if a stress is applied to or concentrated on the first substrate 101 having such a thin thickness, a probability that cracks are created in the first substrate 101 may increase. In particular, the stress may be directly conducted to or concentrated on an interface between the first contact portion 100 and the bump 200 and/or metal lines disposed adjacent to the active region 103, thereby causing cracks in first substrate 101 or delamination of the metal lines.

The bump 200 may have a height of about 0.02 millimeters to about 0.03 millimeters, and the bump 200 and other bumps (not shown) may be electrically insulated from each other by an insulation layer 430 such as a under fill material that fills a space between the first and second substrates 101 and 400. The bump 200 may include a copper pillar bump. In various embodiments, the bump 200 may include a bump body 230 and a protrusion 210 protruding from a portion of the bump body 230, and an area of the second contact surface 203 is greater than that of the first contact surface 201. In this case, the first contact surface 201 may correspond to a top surface of the protrusion 210 substantially opposite to the bump body 230, and the second contact surface 203 may correspond to a bottom surface of the bump body 230 opposite to the protrusion 210. The first contact portion 100 may be exposed by a first window 111 of a first dielectric layer 110 disposed on a surface of the first substrate 101. In various embodiments, when the first window 111 of the first dielectric layer 110 has substantially a rectangular shape or an oval shape in a plan view and the exposed area of the first contact portion 100 is about 36×78 square micrometers, the bump 200 may be formed such that the second contact surface 203 of the bump 200 may have a planar area of about 56×80 square micrometers to about 56×112 square micrometers which is greater than the exposed area of the first contact portion 100. That is, the bump 200 may be formed such that an area of the second contact surface 203 is 1.5 to 2.3 times greater than an area of the first contact surface 201.

In various embodiments, a diameter of the bump body 230 may be greater than that of the protrusion 210 in order that the area of the second contact surface 203 is greater than the area of the first contact surface 201. In such a case, a wetting property or an adhesion characteristic of the adhesion layer 403 contacting the second contact surface 203 may be improved. If the area of the second contact surface 203 is reduced to be close to the area of the first contact surface 201, an amount of the adhesion layer 403 contacting the second contact surface 203 may also be reduced to degrade the adhesion between the bump 200 and the second substrate 400. However, according to an embodiment, the bump 200 may be formed such that the area of the second contact surface 203 is greater than that of the first contact surface 201, as described above. Thus, the adhesion area or the contact area between the bump 200 and the second substrate 400 may be increased to more strongly combine the bump 200 with the second substrate 400. Accordingly, in the event that a design rule of the bumps 200 on the second substrate 400 is looser than that of the bumps 200 on the first substrate 101, the contact reliability of the bump 200 and the second substrate 400 may be improved by increasing a diameter or a width of the bump body 230.

Even though the area of the second contact surface 203 increases, there may be some limitations in increasing the area of the first contact surface 201. This is because the design rule of the first substrate 101 (e.g., a semiconductor chip) is tighter or less than the design rule of the second substrate 400. That is, it may be difficult to increase the contact area between the first contact surface 201 of the bump 200 and the first contact portion 100 of the first substrate 101. Thus, a stress applied to or concentrated on the interface between the first contact surface 201 and the first contact portion 100 may be increased to still cause cracks or delamination of the first contact portion 100. In particular, if only the area of the second contact surface 203 increases without increase of the area of the first contact surface 201, the stress applied to or concentrated on the interface between the first contact surface 201 and the first contact portion 100 may be abruptly increased to cause more cracks in the first substrate 101 and/or severe delamination of metal lines in the first substrate 101.

According to the embodiments, a buffer spring pad portion 300 may be disposed between the first contact surface 201 of the bump 200 and the first contact portion 100 of the first substrate 101, thereby suppressing or preventing the stress applied to the bump 200 from being conducted to the first contact portion 100 or the active region 103 of the first substrate 101. In general, the stress generated when the bump 200 is formed or when the electronic device package is thermally deformed may be concentrated on the interface between the bump 200 and the first contact portion 100. Thus, it may be highly effective that the buffer spring pad portion 300 is disposed between the first contact surface 201 and the first contact portion 100 to alleviate the stress applied to the bump 200.

Referring again to FIGS. 1 and 2, the buffer spring pad portion 300 may be configured to include at least two different conductive layers which are alternately stacked. For example, the buffer spring pad portion 300 may be configured to include a first conductive layer 301 and a second conductive layer 303 which are stacked. In such a case, the first conductive layer 301 may be thinner than the second conductive layer 303. The first and second conductive layers 301 and 303 may have different material properties from each other and different thickness from each other. Thus, a stiffness of the first conductive layer 301 may be different from a stiffness of the second conductive layer 303. For example, the first and second conductive layers 301 and 303 may have a first stiffness k1 and a second stiffness k2, which are different from each other, respectively. Accordingly, the buffer spring pad portion 300 may substantially have a plate-shaped spring structure to produce spring elasticity alleviating or decreasing the stress.

In various embodiments, the first conductive layer 301 and the second conductive layer 303 may be alternately and repeatedly stacked at least twice to constitute the buffer spring pad portion 300. For example, the buffer spring pad portion 300 may be configured to include the first conductive layer 301, the second conductive layer 303, an additional first conductive layer 305 and an additional second conductive layer 307 which are sequentially stacked on the first contact portion 100. The additional first conductive layer 305 may be the same material layer as the first conductive layer 301 and/or the additional second conductive layer 307 may be the same material layer as the second conductive layer 303. In such a case, the additional first conductive layer 305 may have substantially the same thickness as the first conductive layer 301 and/or the additional second conductive layer 307 may have substantially the same thickness as the second conductive layer 303. Alternatively, the additional first conductive layer 305 may have a different thickness from the first conductive layer 301 and/or the additional second conductive layer 307 may have a different thickness as the second conductive layer 303.

In further embodiments, the additional first conductive layer 305 may be a different material layer from the first conductive layer 301, and the additional second conductive layer 307 may be a different material layer from the second conductive layer 303. In such a case, the additional first conductive layer 305 may have substantially the same thickness as the first conductive layer 301 and/or the additional second conductive layer 307 may have substantially the same thickness as the second conductive layer 303. Alternatively, the additional first conductive layer 305 may have a different thickness from the first conductive layer 301 and/or the additional second conductive layer 307 may have a different thickness as the second conductive layer 303.

In still further embodiments, a third conductive layer 309 may be additionally stacked on the additional second conductive layer 307 substantially opposite to the additional first conductive layer 305. The third conductive layer 309 may be relatively thin, like the first conductive layer 301.

The first conductive layer 301 may be formed to include an under bump metal (UBM) layer having a thickness of about a few nanometers to about several tens of nanometers, and the second conductive layer 303 may be formed to include an aluminum layer having a thickness of about several tens of nanometers to about a few micrometers. The additional first conductive layer 305 and/or the third conductive layer 309 may be formed to include an under bump metal (UBM) layer like the first conductive layer 301. Moreover, the additional second conductive layer 307 may be formed to include the same material as the bump 200. For example, the additional second conductive layer 307 may be formed to include a copper material. As described above, the conductive layer 301, 303, 305, 307 or 309 may be formed of an UBM layer, an aluminum layer or a copper layer. However, in various embodiments, the conductive layer 301, 303, 305, 307 or 309 may also be formed to include at least one of a cobalt (Co) layer, a titanium (Ti) layer, a nickel (Ni) layer, a gold (Au) layer and a vanadium (V) layer.

A relatively thin conductive layer among the conductive layers constituting the buffer spring pad portion 300, for example, the third conductive layer 309 may extend to substantially cover the first dielectric layer 110 outside the first window 111, as illustrated in FIG. 2. Further, the first window 111 may be filled with a stack structure formed by alternately stacking the first conductive layer 301 and the second conductive layer 303 twice. For example, the first window 111 may be filled with the first conductive layer 301, the second conductive layer 303, the additional first conductive layer 305 and the additional second conductive layer 307 which are sequentially stacked. A stress applied to or generated from the bump 200 may be concentrated on a sharp corner region, for example, a corner region 114 of the first dielectric layer 110 where the bump 200 and a sidewall of the first window 111 contact each other. However, according to an embodiment, the corner region 114 of the first dielectric layer 110 may be substantially covered with the third conductive layer 309 of the buffer spring pad portion 300. Thus, the third conductive layer 309 may alleviate the stress concentrated on the corner region 114 of the first dielectric layer 110. A second dielectric layer 130 may be disposed on a side of the first dielectric layer 110 substantially opposite to the first substrate 101, and the protrusion 210 of the bump 200 may be disposed to fill a second window 131 penetrating the second dielectric layer 130. In such a case, the third conductive layer 309 may further extend to substantially cover a sidewall of the second window 131 and a corner region of the second dielectric layer 130 outside the second window 131. As such, the third conductive layer 309 may also alleviate the stress applied to the second dielectric layer 130 as well as the stress concentrated on the corner region 114 of the first dielectric layer 110. In various embodiments, at least one of the other conductive layers 301, 303, 305 and 307 except the third conductive layer 309 may also extend onto a surface of the first dielectric layer 110 and/or a surface of the second dielectric layer 130.

The first dielectric layer 110 or the second dielectric layer 130 may include a photo sensitive dielectric layer, for example a photo sensitive polyimide (PSPI) layer. The first dielectric layer 110 may have a third window 113 that exposes a fuse box 105 disposed on or in the first substrate 101 as illustrated in FIG. 1, and the second dielectric layer 130 may fill the third window 113 to protect the fuse box 105. Although not shown in the drawings, redistributed interconnection lines may be additionally disposed on a side of the second dielectric layer 130 substantially opposite to the first dielectric layer 110.

When the second dielectric layer 130 having the second window 131 is introduced into the electronic device package, the third conductive layer 309 may substantially cover a bottom surface and a sidewall of the second window 131 and the protrusion 210 of the bump 200 may fill the second window 131 surrounded by the third conductive layer 309. The bump body 230 connected to the protrusion 210 may extend onto a surface of the second dielectric layer 130 outside the second window 131 to have a greater width than the protrusion 210, and the third conductive layer 309 may extend into an interface between the second dielectric layer 130 and the bump body 230.

As described with reference to FIGS. 1 and 2, the buffer spring pad portion 300 according to the embodiments may alleviate the stress which is applied to or generated from the bump 200. That is, the buffer spring pad portion 300 may suppress or prevent the stress applied to or generated in the bump 200 from being directly conducted to the first contact portion 100 and/or the active region 103 adjacent to the first contact portion 100.

For example, first, second and third groups of electronic device packages were fabricated to evaluate the effects of the embodiments. The first group of electronic device packages were fabricated without employment of the buffer spring pad portions 300, and the second and third groups of electronic device packages were fabricated to include the buffer spring pad portions 300.

In the fabrication of the first to third groups of electronic device packages, each of the first contact portions 100 were formed to have an exposed area of about 36×78 square micrometers, and each of the bumps 200 were formed of a copper material. In addition, all the bumps 200 were formed to have a height of about 0.02 millimeters.

Each of the bumps 200 in the second group of electronic device packages were formed such that the second contact surface 203 had an area of about 56×80 square micrometers, and each of the bumps 200 in the third group of electronic device packages were formed such that the second contact surface 203 had an area of about 56×112 square micrometers. Moreover, each of the buffer spring pad portions 300 in the second and third groups of electronic device packages were formed by sequentially stacking an UBM layer, an aluminum layer, an UBM layer, a copper layer and an UBM layer.

As a result of the stress test to the first to third groups of electronic device packages, the buffer spring pad portions 300 in the second group of electronic device packages alleviated the stress by about 93.4% as compared with the first group of electronic device packages, and the buffer spring pad portions 300 in the third group of electronic device packages alleviated the stress by about 70% as compared with the first group of electronic device packages. Accordingly, it can be understood that the stresses generated in or applied to the bumps 200 are relieved or alleviated because of the presence of the buffer spring pad portions 300. That is, in the event that the buffer spring pad portions 300 are employed in the electronic device packages, it may be possible to increase the areas of the second contact surfaces 203 of the bumps 200 without degradation of reliability. Therefore, the contact reliability between the bumps 200 and the second substrate 400 may be improved.

Figure 3:
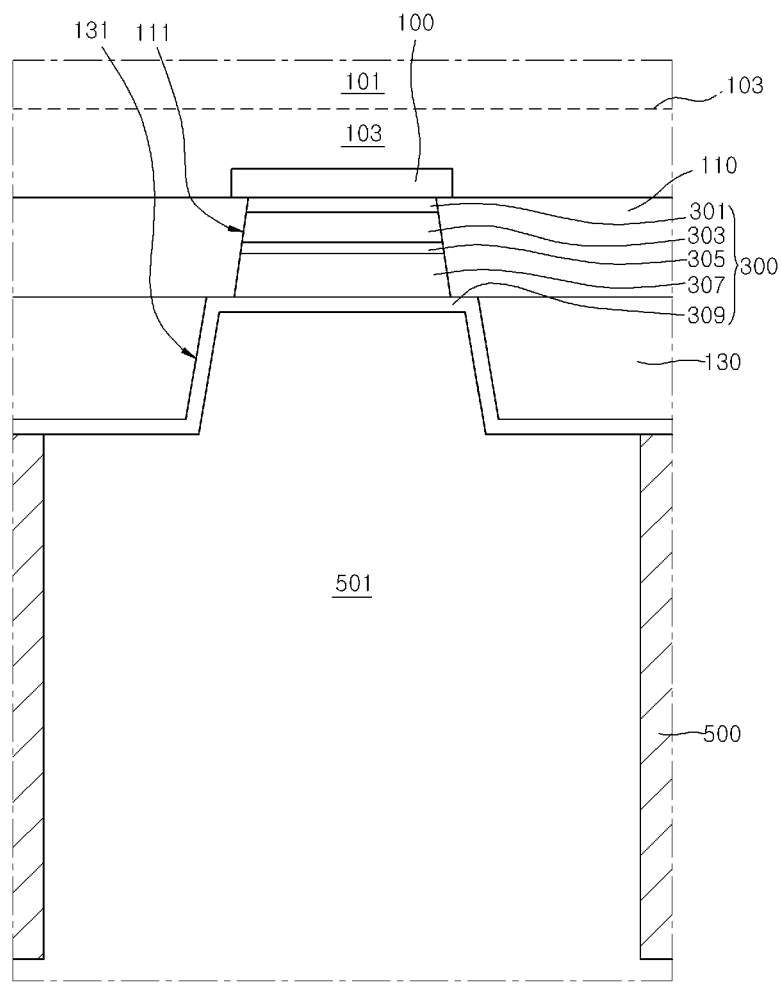
FIGS. 3 and 4 are cross sectional views illustrating a method of manufacturing an electronic device package according to an embodiment.
Figure 4:
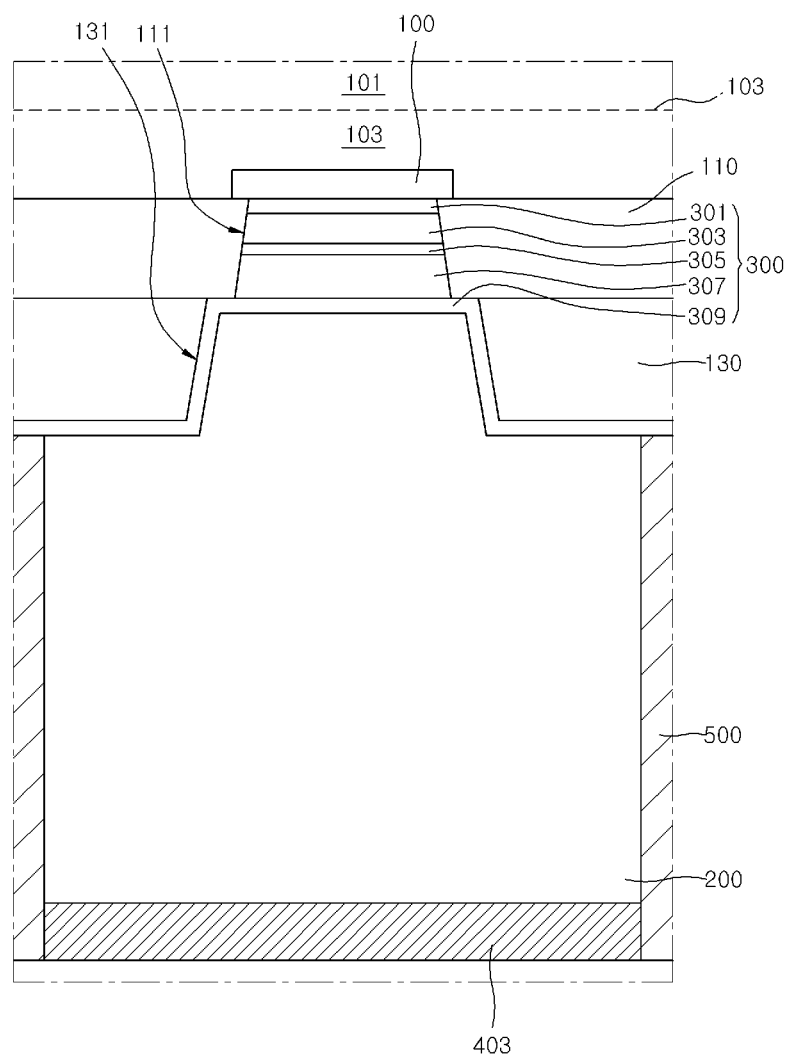

FIGS. 3 and 4 are cross sectional views illustrating a method of manufacturing an electronic device package according to an embodiment.

Referring to FIG. 3, a first substrate 101 including a first contact portion 100 may be provided, and a buffer spring pad portion 300 may be formed on the first contact portion 100. The buffer spring pad portion 300 may be formed by alternately stacking at least two different conductive layers. A first dielectric layer 110 and a second dielectric layer 130 may be formed on the first substrate 101. The first and second dielectric layers 110 and 130 may be patterned to form a first window 111 in the first dielectric layer 110 and a second window 131 in the second dielectric layer 130. Both the first and second windows 111 and 131 may be formed to expose the first contact portion 100. A first conductive layer 301 may be formed on the exposed first contact portion 100. The first conductive layer 301 may be formed of an UBM layer. A second conductive layer 303 may be formed on a side of the first conductive layer 301 substantially opposite to the first contact portion 100. The second conductive layer 303 may be formed of an aluminum layer which is thicker than the first conductive layer 301. An additional first conductive layer 305 may be formed on a side of the second conductive layer 303 opposite to the first conductive layer 301. The additional first conductive layer 305 may be formed of an UBM layer which is thinner than the second conductive layer 303. An additional second conductive layer 307 may be formed on a side of the additional first conductive layer 305 opposite to the second conductive layer 303. The additional second conductive layer 307 may be formed of a copper layer which is thicker than the additional first conductive layer 305. In various embodiments, the first conductive layer 301, the second conductive layer 303, the additional first conductive layer 305 and the additional second conductive layer 307 may be formed in the first window 111.

Subsequently, a third conductive layer 309 may be formed to substantially cover the additional second conductive layer 307 and the second dielectric layer 130. The third conductive layer 309 may be conformally formed in the second window 131. A plating resist pattern 500 may be formed on the third conductive layer 309. The plating resist pattern 500 may be formed to have an opening 501 that exposes the second window 131 surrounded by the third conductive layer 309. As shown in FIG. 4, a copper bump 200 may be formed to fill the opening 501 of the plating resist pattern 500. The copper bump 200 may be formed using a copper plating process. An adhesion layer 403 including a solder layer may be formed on a surface of the copper bump 200 substantially opposite to the first substrate 101.

The plating resist pattern 500 may then be removed to expose a sidewall of the copper bump 200. The adhesion layer 403 may be attached or bonded to a second contact surface (401 of FIG. 1) of a second substrate (400 of FIG. 1), and an under fill material may be introduced into a space between the first and second substrates 101 and 400 to form an insulation layer (430 of FIG. 1). As a result, a flip chip package may be fabricated.

Figure 5:
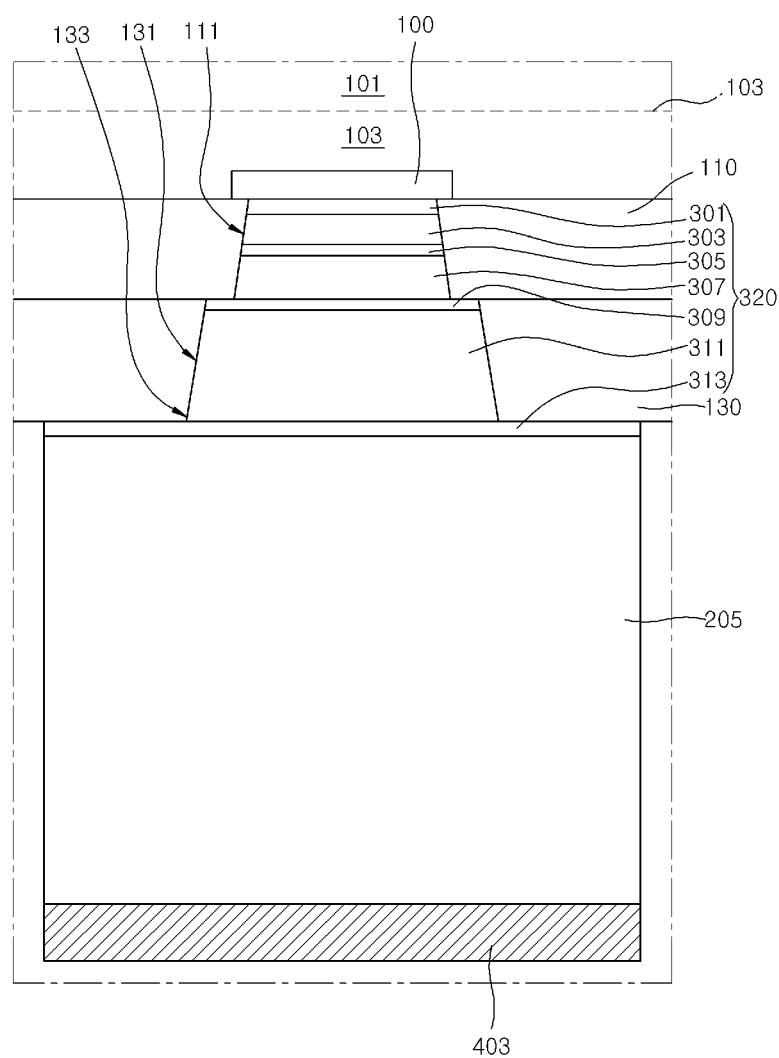
FIG. 5 is a cross sectional view illustrating an electronic device package according to an embodiment and a method of manufacturing the same.

FIG. 5 is a cross sectional view illustrating an electronic device package according to an embodiment and a method of manufacturing the same. The present embodiment is similar to the previous embodiment described with reference to FIGS. 1, 2, 3 and 4. Thus, to avoid duplicate explanation, differences between the present embodiment and the previous embodiment illustrated in FIGS. 1, 2, 3 and 4 will be mainly described in detail hereinafter.

Referring to FIG. 5, a buffer spring pad portion 320 according to the present embodiment may be formed to fill both the first and second windows 111 and 131 illustrated in FIGS. 1, 2, 3 and 4. Specifically, the buffer spring pad portion 320 may be formed to include the first conductive layer 301, the second conductive layer 303, the additional first conductive layer 305 and the additional second conductive layer 307 sequentially stacked in the first window 111, the third conductive layer 309 and a fourth conductive layer 311 stacked in the second window 131, and a fifth conductive layer 313 disposed on the fourth conductive layer 311 and a corner region 133 of the second dielectric layer 130 outside the second window 131. The fourth conductive layer 311 may be formed to include a copper layer, and the fifth conductive layer 313 may be formed to include an UBM layer. A bump 205 without any protrusion may be disposed on the fifth conductive layer 313 substantially opposite to the second dielectric layer 130. A surface of the fourth conductive layer 311 opposite to the third conductive layer 309 may be substantially coplanar with a surface of the second dielectric layer 130 substantially opposite to the first dielectric layer 110. As a result, the fifth conductive layer 313 may be formed to be substantially flat. Thus, the fifth conductive layer 313 may alleviate or relieve the stress applied to the corner region 133 of the second dielectric layer 130.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An electronic device package comprising:
   a first substrate having a first contact portion disposed thereon;
   a second substrate having a second contact portion opposite to the first contact portion;
   a first dielectric layer disposed on the first substrate to have a first window exposing the first contact portion;
   a buffer spring pad portion covering the exposed surface portion of the first contact portion; and
   a bump protruding from a surface of the first dielectric layer to the second substrate, the bump has a first contact surface covering the buffer spring pad portion to be electrically connected to the first contact portion and a second contact surface disposed opposite to the first contact surface to be electrically connected to the second contact portion;
   wherein the buffer spring pad portion includes at least two different conductive material layers which overlap each other.

2. The electronic device package of claim 1, wherein the at least two different conductive material layers have different thickness from each other.

3. The electronic device package of claim 1, wherein the buffer spring pad portion includes a first conductive layer and a second conductive layer which is thicker than the first conductive layer.

4. The electronic device package of claim 3, wherein the first conductive layer is in contact with the first contact portion.

5. The electronic device package of claim 3, wherein the buffer spring pad portion further includes at least one additional first conductive layer and at least one additional second conductive layer which are alternatively stacked on a surface of the second conductive layer opposite to the first conductive layer.

6. The electronic device package of claim 5, wherein the first conductive layer and the at least one additional first conductive layer are the same material layer or different material layers, and the second conductive layer and the at least one additional second conductive layer are the same material layer or different material layers.

7. The electronic device package of claim 3, wherein the buffer spring pad portion further includes a third conductive layer which is stacked on a surface of the second conductive layer opposite to the first conductive layer and which is thinner than the second conductive layer.

8. The electronic device package of claim 7:
   wherein the third conductive layer extends to substantially cover a corner region of the first dielectric layer outside the first window; and
   wherein a surface of the second conductive layer opposite to the first conductive layer is substantially coplanar with a surface of the first dielectric layer opposite to the first substrate.

9. The electronic device package of claim 7, wherein the third conductive layer includes substantially the same material layer as the first conductive layer.

10. The electronic device package of claim 7, wherein the first, second or third conductive layer includes at least one of an aluminum (Al) layer, a copper (Cu) layer, a cobalt (Co) layer, a titanium (Ti) layer, a nickel (Ni) layer, a gold (Au) layer and a vanadium (V) layer.

11. The electronic device package of claim 7, wherein each of the first and third conductive layers includes an under bump metal (UBM) layer, and the second conductive layer includes an aluminum (Al) layer or a copper (Cu) layer.

12. The electronic device package of claim 7, wherein the second conductive layer includes substantially the same material as the bump.

13. The electronic device package of claim 1, further comprising a second dielectric layer on a surface of the first dielectric layer opposite to the first substrate,
wherein the buffer spring pad portion is disposed in the first window and is exposed by a second window penetrating the second dielectric layer.

14. The electronic device package of claim 13, wherein the bump includes:
a protrusion filling the second window; and
a bump body extending from the protrusion onto a surface of the second dielectric layer outside the second window,
wherein the bump body has a diameter or a width which is greater than that of the protrusion.

15. The electronic device package of claim 14, wherein a portion of the buffer spring pad portion extends onto a surface of the second dielectric layer opposite to the first dielectric layer.

16. The electronic device package of claim 13:
wherein the buffer spring pad portion extends to fill the second window;
wherein the buffer spring pad portion includes at least one first conductive layer and at least one second conductive layer which are alternately stacked in the first window, a third conductive layer and a fourth conductive layer stacked in the second window, and a fifth conductive layer disposed on the fourth conductive layer and the second dielectric layer; and
wherein the fifth conductive layer is thinner than the fourth conductive layer.

17. The electronic device package of claim 16:
wherein a surface of the fourth conductive layer opposite to the third conductive layer is substantially coplanar with a surface of the second dielectric layer opposite to the first dielectric layer;
wherein the fifth conductive layer extends to substantially cover the surface of the second dielectric layer; and
wherein the bump is in contact with a surface of the fifth conductive layer opposite to the fourth conductive layer.

18. The electronic device package of claim 17, wherein the fourth conductive layer includes the same conductive material as the bump and the fifth conductive layer includes an under bump metal (UBM) layer.

19. The electronic device package of claim 1, wherein at least one of the first substrate and a second substrate includes a semiconductor substrate having an integrated circuit or a package substrate on which the semiconductor substrate is mounted.

20. An electronic device package comprising:
a first substrate having a first contact portion disposed thereon;
a second substrate having a second contact portion opposite to the first contact portion;
a first dielectric layer disposed on the first substrate to have a first window exposing the first contact portion;
a buffer spring pad portion covering the exposed surface portion of the first contact portion; and
a bump protruding from a surface of the first dielectric layer to the second substrate, the bump has a first contact surface covering the buffer spring pad portion to be electrically connected to the first contact portion and a second contact surface disposed opposite to the first contact surface to be electrically connected to the second contact portion;
wherein the buffer spring pad portion includes a plurality of conductive material layers which overlap each other in the first window.

21. The electronic device package of claim 20, wherein the buffer spring pad portion includes a first under bump metal (UBM) layer, a aluminum (Al) layer, a second under bump metal (UBM) layer, a copper (Cu) layer and a third under bump metal (UBM) layer which are sequentially stacked in the first window.

22. The electronic device package of claim 20, further comprising a second dielectric layer stacked on a surface of the first dielectric layer opposite to the first substrate,
wherein the buffer spring pad portion is exposed by a second window penetrating the second dielectric layer,
wherein the bump includes a protrusion disposed in the second window to contact the buffer spring pad portion and a bump body extending from the protrusion onto a surface of the second dielectric layer outside the second window, and
wherein the bump body has a diameter or a width which is greater than that of the protrusion.

23. A method of manufacturing an electronic device package, the method comprising:
providing a first substrate having a first contact portion;
providing a second substrate having a second contact portion opposite to the first contact portion;
overlapping at least two different conductive material layers on the first contact portion to form a buffer spring pad portion; and
forming a bump protruding from a surface of the first dielectric layer to the second substrate, the bump has a first contact surface covering the buffer spring pad portion to be electrically connected to the buffer spring pad portion and a second contact surface located opposite to the first contact surface to be electrically connected to the second contact portion,
wherein the buffer spring pad portion covers the exposed surface portion of the first contact portion to suppress or prevent a stress applied to or generated in the bump from being conducted to the first contact portion and an active region of the first substrate.

* * * * *